US012772492B2

(12) United States Patent
Wang

(10) Patent No.: US 12,772,492 B2
(45) Date of Patent: Oct. 20, 2026

(54) NLDMOS SEMICONDUCTOR DEVICE

(71) Applicant: CSMC TECHNOLOGIES FAB2 CO., LTD., Jiangsu (CN)

(72) Inventor: Qiong Wang, Jiangsu (CN)

(73) Assignee: CSMC Technologies Fab2 Co., Ltd., Jiangsu (CN)

( * ) Notice: Subject to any disclaimer, the term of this patent is extended or adjusted under 35 U.S.C. 154(b) by 486 days.

(21) Appl. No.: 18/260,140

(22) PCT Filed: Aug. 17, 2021

(86) PCT No.: PCT/CN2021/113009

§ 371 (c)(1),
(2) Date: Jun. 30, 2023

(87) PCT Pub. No.: WO2022/142370

PCT Pub. Date: Jul. 7, 2022

(65) Prior Publication Data

US 2024/0055516 A1 Feb. 15, 2024

(30) Foreign Application Priority Data

Dec. 31, 2020 (CN) ......................... 202011624301.3

(51) Int. Cl.
*H10D 30/65* (2025.01)
*H10D 62/10* (2025.01)
(Continued)

(52) U.S. Cl.
CPC ......... *H10D 30/655* (2025.01); *H10D 62/116* (2025.01); *H10D 62/126* (2025.01); *H10D 64/111* (2025.01); *H10D 64/519* (2025.01)

(58) Field of Classification Search
CPC .. H10D 30/655; H10D 62/116; H10D 30/603; H10D 62/378; H10D 64/516;
(Continued)

(56) References Cited

U.S. PATENT DOCUMENTS 6,150,697 A 11/2000 Teshigahara et al.
10,461,182 B1 * 10/2019 Edwards ............ H10D 30/0285
(Continued)

FOREIGN PATENT DOCUMENTS

CN 101789041 A 7/2010
CN 105514102 A 4/2016
(Continued)

*Primary Examiner* — Shahed Ahmed
(74) *Attorney, Agent, or Firm* — MUNCY, GEISSLER, OLDS & LOWE, P.C.

(57) ABSTRACT

This application provides a semiconductor device. The semiconductor device includes: a substrate (101) having a first conductivity type; an STI structure (108) disposed in the substrate (101) in the form of a first ring-like structure and surrounding a portion of the substrate (101), wherein a portion of the substrate surrounded by the STI structure serves as an active area (105); a drain doped region (103) disposed an a top of a central portion of the active area (105) and having a second conductivity type; source doped regions (102) having the second conductivity type, wherein the source doped regions are disposed at the top of the active area (105) on opposite sides of the drain doped region (103) and are spaced apart from the drain doped region (103); a field oxide layer (104) that is disposed over the top surface of the substrate (101) within the active area (105) in the form of a second ring-like structure and surrounds the drain doped region (103); gate polysilicon (106) that is disposed over the top surface of the substrate (101) and is in the form of a third ring-like structure surrounding the field oxide layer (104); and a drift region (107) having the second conductivity type wherein the drift region is disposed in the substrate (101) and surrounds the drain doped region (103).

16 Claims, 2 Drawing Sheets

(51) Int. Cl.
*H10D 64/00* (2025.01)
*H10D 64/27* (2025.01)

(58) Field of Classification Search
CPC ................. H10D 89/00; H10D 62/124; H10D 30/0281–0289; H10D 30/65–659; H01L 21/762; H01L 21/76224; H01L 21/76202–76221; H01L 21/76235
See application file for complete search history.

(56) References Cited

U.S. PATENT DOCUMENTS

| | | | | |
|---|---|---|---|---|
| 2019/0259829 | A1* | 8/2019 | Mun | H10D 64/258 |
| 2020/0006550 | A1 | 1/2020 | Todd et al. | |
| 2020/0044081 | A1 | 2/2020 | Kumar et al. | |
| 2021/0028298 | A1* | 1/2021 | Shin | H10D 62/116 |
| 2021/0320203 | A1* | 10/2021 | Li | H01L 21/76229 |
| 2022/0069123 | A1* | 3/2022 | Chiu | H10D 64/257 |

FOREIGN PATENT DOCUMENTS

| | | | |
|---|---|---|---|
| CN | 105938851 | A | 9/2016 |
| CN | 108133962 | A | 6/2018 |
| CN | 110176486 | A | 8/2019 |
| WO | WO-2009/079561 | A1 | 6/2009 |
| WO | WO2016124086 | A1 | 8/2016 |

* cited by examiner

NLDMOS SEMICONDUCTOR DEVICE

CROSS-REFERENCE TO RELATED APPLICATION

This application claims the priority of Chinese patent application number 202011624301.3, filed on Dec. 31, 2020, entitled "Semiconductor Device" the entire contents of which are incorporated herein by reference.

TECHNICAL FIELD

This application relates to the field of semiconductor technology and, in particular, to a semiconductor device.

BACKGROUND

In the design of N-type laterally-double diffused metal-oxide semiconductor (NLDMOS) devices, shallow trench isolation (STI) in a drift region has fallen short of satisfying the requirements to help in withstand voltage performance. This is mainly because, in order to enable a high-voltage NLDMOS device to have desired high withstand voltage and low on-resistance properties, it is necessary to increase dopant concentration of the drift region, however, a high electric field strength would be present at the corners of an STI structure due to the structure's own morphological characteristics. In high voltage applications, particularly for ultra-high voltage applications where a withstand voltage requirement is greater than 100V, such a high electric field strength may cause premature breakdown and burnout of the device and serious degradation of its electrical properties, thus limiting the use of the NLDMOS device in extra high voltage applications.

In order to overcome this problem, some improvements have been made, such as replacing the STI structure in the drift region with a local oxidation of silicon (LOCOS) structure. Although this approach can help in effective boosting of the device's withstand voltage performance, combining of the LOCOS and STI processes with reduced adverse effects on the device performance remains a problem to be solved

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In order to overcome at least one of the problems with the conventional devices, in a first aspect of the present application, there is provided a semiconductor device comprising:

a substrate having a first conductivity type;

an STI structure that is disposed in the substrate in the form of a first ring-like structure and surrounds a portion of the substrate, wherein a portion of the substrate surrounded by the STI structure serves as an active area;

a drain doped region that is disposed at a top of a central portion of the active area, and has a second conductivity type that is opposite to the first conductivity type;

source doped regions having the second conductivity type, wherein the source doped regions are disposed at the top of the active area on opposite sides of the drain doped region and are spaced apart from the drain doped region, and wherein a line connecting the drain doped region and the source doped regions defines a first direction, and a second direction is defined to be perpendicular to the first direction in a plane of the substrate;

a field oxide layer disposed over a top surface of the substrate within the active area, the field oxide layer being in a form of a second ring-like structure and surrounding the drain doped region, wherein an outer boundary of the field oxide layer is spaced from the STI structure by a predetermined distance that is greater than 0;

a gate polysilicon that is disposed over the top surface of the substrate and is in a form of a third ring-like structure surrounding the field oxide layer, wherein the gate polysilicon extends in the first direction from a position over the source doped regions to a position over the field oxide layer, wherein the gate polysilicon extends in the second direction from a position over the STI structure to a position over the field oxide layer, and wherein a gate oxide layer is provided between the gate polysilicon and the substrate; and a drift region having the second conductivity type, wherein the drift region is disposed in the substrate, surrounds the drain doped region and is spaced apart from the source doped regions, and wherein the drift region extends in the second direction to a position under the STI structure.

The details of one or more embodiments of the application are set forth in the accompanying drawings and the description below. Other features, objects, and advantages of the application will be apparent from the description and drawings, and from the claims.

BRIEF DESCRIPTION OF THE DRAWINGS

The accompanying drawings, which are incorporated in and constitute a part of the present application, are provided to assist in an understanding thereof and illustrate embodiments of this application and, together with the description, serve to explain the principles of the application.

In the drawings.

DETAILED DESCRIPTION

Figure 1:
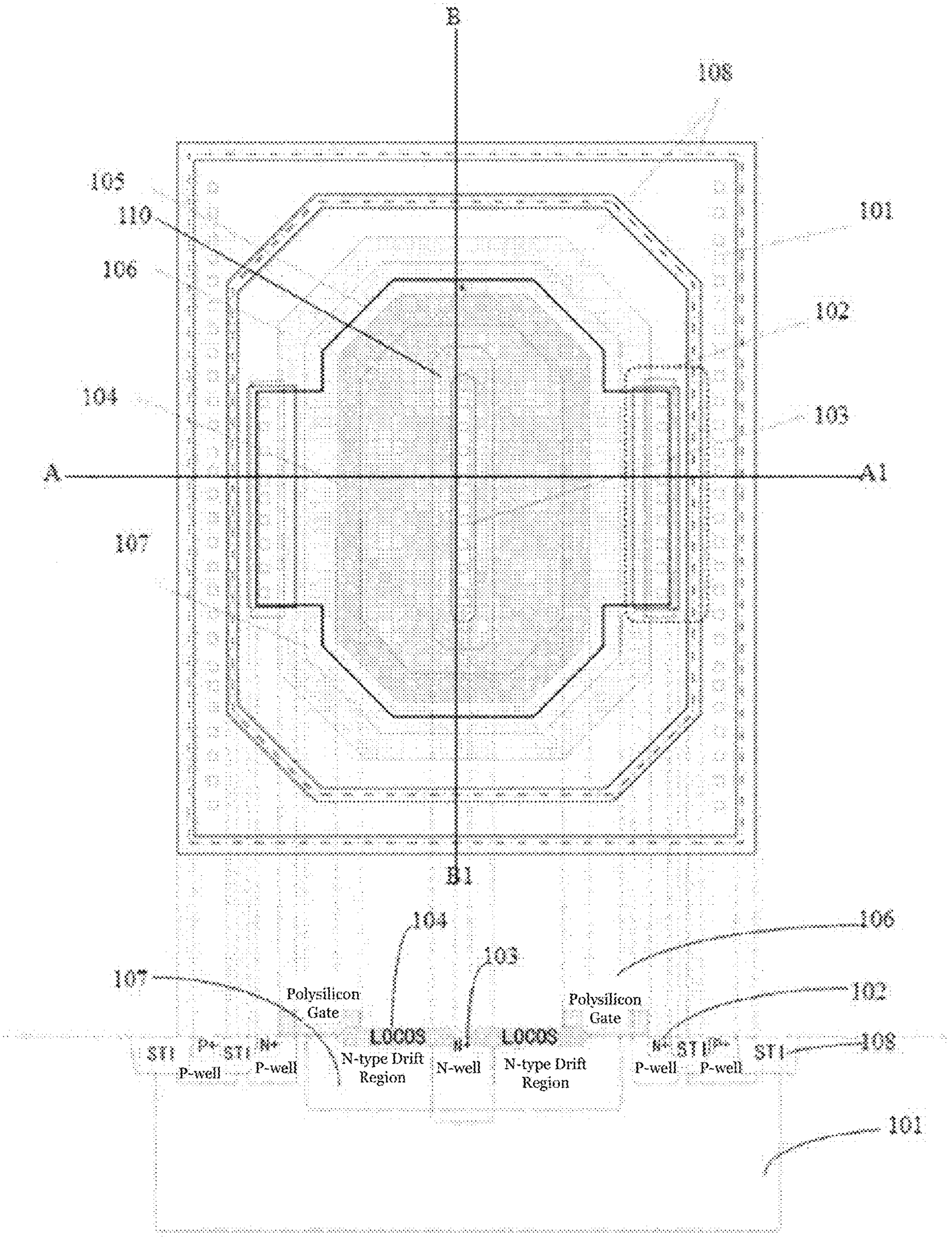
FIG. 1 shows a schematic top view and a cross-sectional view along A-A1 of a semiconductor device according to an embodiment of the present application.

The following description sets forth numerous specific details in order to provide a more thorough understanding of the present application. However, it will be apparent to those skilled in the art that this application can be practiced without one or more of these specific details. In other instances, well-known technical features have not been described in order to avoid unnecessary obscuring of the application.

It is to be understood that the invention may be embodied in many different forms and should not be construed as limited to the embodiments set forth below. Rather, these embodiments are provided so that this disclosure is thorough and conveys the scope of the invention to those skilled in the art. In the drawings, the thickness of layers and regions may be exaggerated for clarity, and like reference numerals refer to like elements throughout.

The terminology used herein is for the purpose of describing particular embodiments only and is not intended to be limiting of the application. As used herein, the singular forms “a”, “an” and “the” are intended to include the plural forms as well, unless the context clearly indicates otherwise. It will be further understood that the terms “comprises” and/or comprising” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of the associated listed items.

For a thorough understanding of the present application, detailed structures and steps will be presented in the following description in order to explain the subject matter of the application. Although preferred embodiments of this application are described in detail below, the application may have other embodiments in addition to those detailed herein.

Exemplary structures compatible with both local oxidation of silicon (LOCOS) and shallow trench isolation (STI) processes are as described below.

An NLDMOS device includes a channel and a source terminal, both disposed around a center thereof. A drift region and an LOCOS layer are both provided in the form of rings surrounding the above two, and a drain electrode is provided as a terminal for the drift region in the form of an outermost ring. Although this design separates the STI from the LOCOS, it is disadvantageous in that since the drift region is joined to the outer side of the isolation region, it has to be expanded in size to enable the external PN junction to have a satisfactory withstand voltage. Consequently, the size of the drift region is much larger than a drift region size required by the device’s own withstand voltage, leading to a great wasted area and making the product less competitive.

Another NLDMOS device includes a drift region and a drain terminal, both disposed around a center thereof in the form of strips. A channel and a source terminal are arranged around opposite edges of the device, and an LOCOS structure is provided in the drift region in the form of a strip extending beyond the active area, resulting in an overlap between the LOCOS and STI regions. Although this design circumvents the withstand voltage problem of the drift region and the external P-type junction, it is disadvantageous in that the overlap between the LOCOS and STI regions leads to repeated etching, exposure, thermal and other processes being performed in the overlapped area, which may cause defects and interface states at the device surface. As a consequence, the surface may be morphologically impaired, making the device impossible to pass a reliability test and with seriously degraded properties.

In a device, an interface between LOCOS and STI regions is directly made external to the entirety of a working area. That is, isolation of the device’s source, bulk, drain and other internal regions is all accomplished by the LOCOS region which further serves to ensure a withstand voltage requirement of a drift region of the device. In contrast, the STI structure disposed external to a bulk ring of the device is intended only to isolate the device from another device. Although this design clearly separates the STI from the LOCOS region, limited by the characteristics of existing LOCOS techniques, an internal isolation area of the device is much larger compared to the STI approach. For instance, a source region can be typically isolated sufficiently from a bulk region by an STI size of 0.36 μm. However, an LOCOS process requires at least 0.6-0.8 μm to achieve this. Therefore, when used in the design of highly integrated chip circuits, this will lead to an extremely great wasted area. Further, since relationships between LOCOS/STI isolation interfaces of different devices must be taken into account, the complexity of platform development and design will be increased.

This application provides a semiconductor device which, as shown in FIG. 1, includes:

- a substrate 101 having a first conductivity type;
- an STI structure 108 disposed in the substrate 101 in the form of a first ring-like structure, wherein a portion of the substrate 101 surrounded by the STI structure 108 serves as an active area 105;
- a drain doped region 103 that is disposed at a top of a central portion of the active area 105 and has a second conductivity type that is opposite to the first conductivity type;
- source doped regions 102 having the second conductivity type, wherein the source doped regions 102 are disposed at the top of the active area 105 on opposite sides of the drain doped region and is spaced apart from the drain doped region 103, wherein a line connecting the drain doped region 103 and the source doped regions 102 defines a first direction, and a second direction is defined to be perpendicular to the first direction in a plane of the substrate 101;
- a field oxide layer 104 that is disposed over the top surface of the substrate 101 within the active area 105, the field oxide layer 104 being in the form of a second ring-like structure and surrounding the drain doped region 103, wherein an outer boundary of the field oxide layer 104 is spaced from the STI structure 108 by a predetermined distance that is greater than 0;
- gate polysilicon 106 that is disposed over the top surface of the substrate 101 and is in the form of a third ring-like structure surrounding the field oxide layer 104, the gate polysilicon 106 extending in the first direction from a position over the source doped regions 102 to a position over the field oxide layer 104, the gate polysilicon 106 extending in the second direction from a position over the STI structure 108 to a position over the field oxide layer 104, the gate polysilicon 106 separated from the substrate 101 by a gate oxide layer; and
- a drift region 107 having the second conductivity type, wherein a drift region 107 is disposed in the substrate 101, surrounds the drain doped region 103, and is spaced apart from the source doped regions 102, the drift region 107 extending in the second direction to a position under the STI structure 108.

According to this application, the STI structure is provided to define a boundary of the active area, and the field oxide layer is formed in the active area. With this arrangement, the STI structure is completely separated from the field oxide layer. This improvement effectively avoids surface damage to the device resulting from repeated etching and exposure processes while not compromising the device’s overall size and high withstand voltage performance requirement, thus helping to solve the property degradation and reliability problems.

The semiconductor device of this application will be described in detail below with reference to the accompanying drawings, in which FIG. 1 shows a schematic top view and a cross-sectional view along A-A1 of the semiconductor device according to an embodiment of the present application.

In FIG. 1, the substrate 101 in the semiconductor device is represented by a rectangular area. The substrate 101 may be at least one of the following materials: silicon, polysilicon or silicon-on-insulator (SOI).

In one embodiment of this application, the substrate 101 is silicon.

In one embodiment of this application, the substrate 101 is a doped substrate 101 of the first conductivity type, e.g., a P-type substrate 101.

The STI structure 108 (STI) in the semiconductor device is disposed in the substrate in the form of a first ring-like structure. Assuming the plane of the substrate is horizontal, a projection of the ring-like structure on the horizontal plane will be annular. A portion of the substrate surrounded by the STI structure 108 serves as the active area 105. In one example, the first ring-like structure is an octagon.

Thus, the STI structure 108 in the substrate 101 divides the substrate 101 into a field area and the active area 105 that is surrounded by the STI structure 108. Therefore, an outer boundary of the active area 105 is also an inner boundary of the STI structure.

The STI structure 108 includes a trench, in which an isolation oxide may be optionally filled. The STI structure 108 may be configured and fabricated using a conventional technique and, therefore, need not be described in further detail herein.

According to this application, with continued reference to FIG. 1, a portion of the active area 105 extending in the second direction B-B1 acts as a withstand voltage region of the device, and a portion of the active area 105 extending in the first direction A-A1 between the drain doped region and the source doped regions serves as an operating and withstand voltage region of the device. Dimensions of the withstand voltage region and dimensions of the operating and withstand voltage region must meet the withstand voltage requirements of the semiconductor device of the present application. The first direction A-A1 is a lengthwise direction of a conduction channel in the device, and the second direction B-B1 is a widthwise direction of the conduction channel in the device.

The source doped regions 102 and the drain doped region 103 are formed in the operating and withstand voltage region and arranged in a row along the first direction A-A1, as shown in FIG. 1.

In one embodiment of this application, the first direction A-A1 is the lengthwise direction of the conduction channel in the device, along which the drain doped region 103, the gate polysilicon 106 and the source doped regions 10 are arranged from the left to the right. Moreover, pickup structures for the P-type substrate 101 may be further arranged at the outer side of the source doped regions 102.

The source doped regions 102 and the drain doped region 103 are formed by ion implantation, a further description of which is deemed unnecessary and omitted herein.

The drain doped region 103 has the second conductivity type which is, for example, the N-type. The first conductivity type is opposite to the second conductivity type. The drain doped region 103 is disposed at the top surface of the central portion of the active area. The source doped regions 102 has the second conductivity type which is, for example, the N-type, and are disposed at the top surface of the active area on opposite sides of the drain doped region. Moreover, the source doped regions 102 are spaced apart from the drain doped region.

When viewed horizontally, extension regions are disposed respectively above and under the operating region and on the withstand voltage region of the NLDMOS device. In this application, the withstand voltage structures in the first direction A-A1 (i.e., the lengthwise direction of the conduction channel) and in the second direction B-B1 (i.e., the widthwise direction of the conduction channel) are consistent with each including the active area 105. Therefore, the withstand voltage dimension in the first direction A-A1 is applicable to the second direction B-B1. This helps in reducing the device's dimension in the second direction B-B1.

The active area 105 generally comprises an octagon in the second direction B-B1, and the area extends beyond the octagonal area in the first direction A-A1 in which the source doped regions 102 are located, as shown in FIG. 1. A critical dimension of the active area 105 in the second direction B-B1 is greater than a critical dimension of the active area 105 in the first direction A-A1.

In this application, the field oxide layer 104 is disposed within the active area 105 in the form of a second ring-like structure surrounding the drain doped region. An outer boundary of the field oxide layer 104 is spaced from the STI structure by a predetermined distance that is greater than 0 The second ring-like structure is also an octagon.

In one embodiment of this application, the field oxide layer 104 is a local oxidation of silicon (LOCOS) field oxide layer 104 formed by selective oxidation of silicon using silicon nitride as a mask, referred hereinafter as the field oxide layer 104.

The field oxide layer 104 is located within the boundary of the active area 105. A boundary of the field oxide layer 104 is spaced from the boundary of the active area 105 by a certain distance. The inner boundary of the STI structure 108 coincides with the outer boundary of the active area 105. Through introducing stratification to the active area 105 in the second direction B-B1, the field oxide layer 104 (e.g., LOCOS) can be spaced apart and isolated from the STI region in the same direction, thus avoiding defects, interface states and other morphological problems caused by repeated etching, exposure, and other processes during fabrication of the STI and the field oxide layer 104 (LOCOS) and resulting in additional improvements in the device's performance and yield.

The distance k between the boundaries of the active area 105 and the field oxide layer 104 in the second direction B-B1 should not be too small, in order to ensure desirable withstand voltage performance of the NLDMOS device in the second direction B-B1. On the other hand, it should also not be too large. In one embodiment of this application, the distance between the boundary of the active area 105 and the outer boundary of the field oxide layer 104 lies in the range of 0.5 μm and 0.8 μm. That is, in the second direction, the predetermined distance of the outer boundary of the field oxide layer from the STI structure is between 0.5 μm and 0.8 μm.

A length of the field oxide layer 104 in the first direction A-A1 is smaller than a length of the field oxide layer in the second direction B-B1.

Additionally, according to this application, the drift region 107, as shown in FIG. 1, is formed in the substrate 101 and has the opposite conductivity type to the conductivity type of the substrate 101. The drift region 107 is arranged in the substrate 101 and surrounds the drain doped region 103 and is spaced apart from the source doped regions 102. Further, the drift region 107 extends in the second direction B-B1 to a position under the STI structure.

For example, in one embodiment of this application, the substrate 101 is P-type doped, while the drift region 107 is N-type doped.

The drift region 107 is an octagon. For example, in one embodiment of this application, the drift region 107 is an octagonal structure as view from the top. The LOCOS is formed on the drift region 107, and an outer boundary of the drift region 107 totally encircles and surrounds the outer boundary of the LOCOS.

Further, according to this application, the semiconductor device further comprises the gate polysilicon 106 which encircles and surrounds the field oxide layer 104.

Furthermore, an N-well 110 is formed in the drift region 107, and the drain doped region 103 is formed in the N-well 110. The N-well 110 may extend downward to a depth that is greater than a depth of the drift region 107.

In one embodiment of this application, in the first direction, the gate polysilicon 106 extends from boundaries of the source doped regions 102 in the active area 105 in the channel region to a position over the field oxide layer 104. The gate polysilicon 106 located over the field oxide layer serves as a field plate structure, which can additionally enhance withstand voltage of the device. With this arrangement, the NLDMOS device can meet the withstand voltage requirements of high-voltage applications, particularly for the NLDMOS devices with a withstand voltage requirement being equal to or greater than 100V. The gate polysilicon 106 comprises the form of a third ring-like structure that is an octagon.

A geometric center of the first ring-like structure in a horizontal plane, a geometric center of the second ring-like structure in a horizontal plane, a geometric center of the third ring-like structure in a horizontal plane and a geometric center of an outer contour of the drift region in a horizontal plane are in coincidence.

The semiconductor device further includes interconnection structure implemented as one of through holes and plugs. With these interconnection structures, the source doped regions 102, the drain doped region 103, the gate polysilicon 106 and the substrate 101 are electrically connected to respective pickups on a package.

Figure 2:
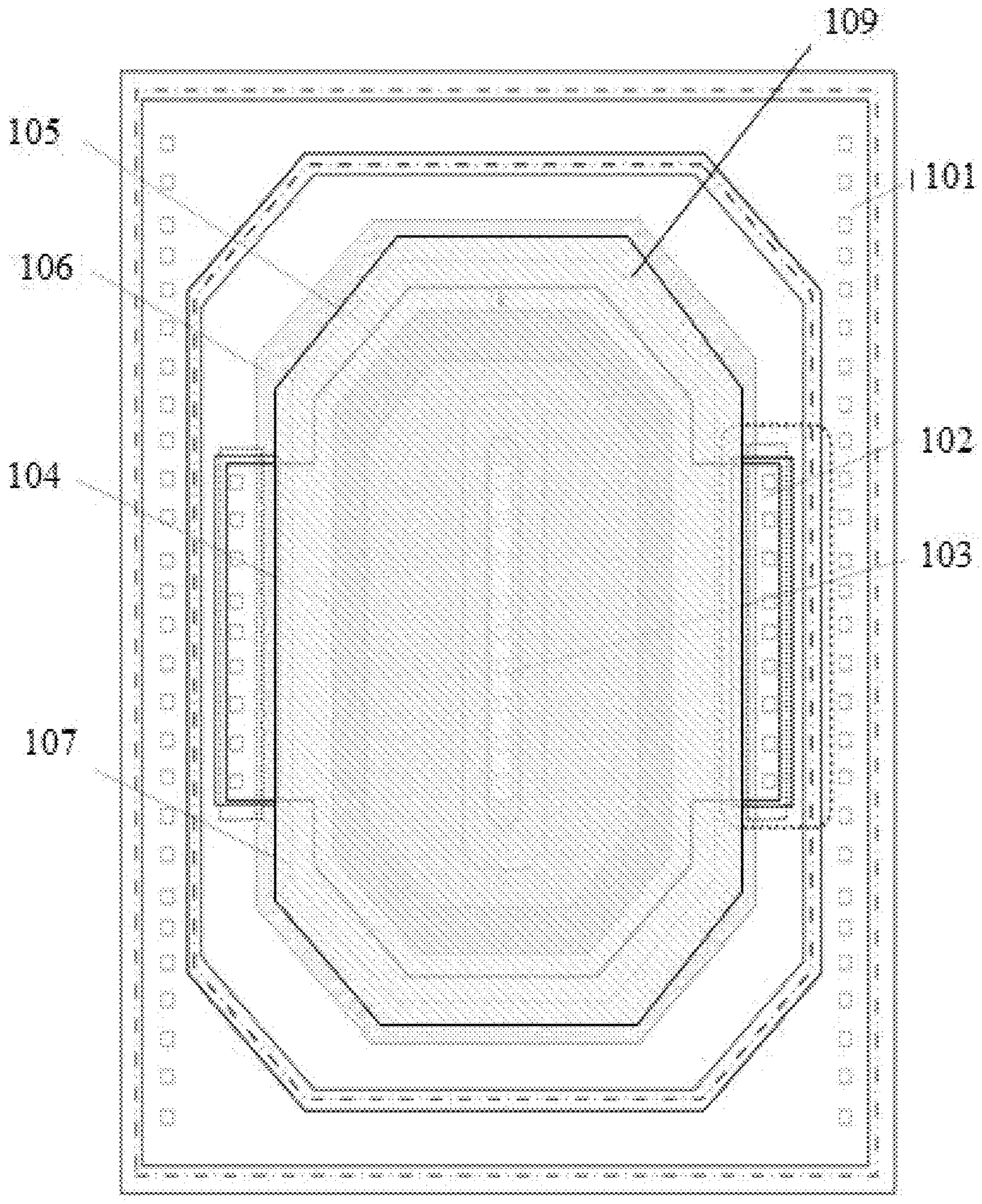
FIG. 2 shows a schematic top view of a semiconductor device according to another embodiment of the present application.

In one embodiment, the semiconductor device further includes a metal field plate 109. In this case, a schematic top view of the semiconductor device is shown in FIG. 2. The metal field plate 109 spans over the gate polysilicon 106 and the field oxide layer 104. A dielectric layer is arranged between the metal field plate 109 and the gate polysilicon 106, and another dielectric layer is arranged between the metal field plate 109 and the field oxide layer 104. The metal field plate 109 is located above the drift region and is sized greater than the gate. It helps further enhance withstand voltage of the NLDMOS device's drift region, facilitating its satisfaction of the withstand voltage requirements of high-voltage applications, particularly satisfying the withstand voltage requirement of the NLDMOS devices, which is equal to or greater than 100V.

According to the present application, improvements are made by further including the field oxide layer on the basis of the STI process, and the novel high-voltage semiconductor device is accordingly proposed. The field oxide layer is present only in the drift region of the high-voltage device and can be effectively isolated from the STI region in both the first and second directions. In this way, without any compromise on the device area or the isolation region area, adverse effects of surface defects, irregular morphology and other problems that may be caused by repeated etching, exposure and other processes conducted on an overlap between the field oxide layer and STI regions can be avoided.

The terms used herein have the same meaning as commonly understood by one of ordinary skill in the art to which this invention pertains. The terminology used herein is for the purpose of describing particular embodiments only and is not intended to be limiting of the invention. As used herein, the terms "component", "member" and the like refer to either a single part or a combination of multiple parts. As used herein, the terms "mounting", "arrangement" and the like may refer to either direct attachment of one component to another, or attachment of one component to another via an intervening member. A feature described in one embodiment herein may be applied to another embodiment, either alone or in combination with another feature, unless it is inapplicable to the other embodiment, or unless specified otherwise.

Although the present application has been described with reference to the foregoing embodiments, it is to be understood that the above embodiments are provided for the only purpose of exemplification and illustration and are not intended to limit the application to the scope of the described embodiments. Moreover, those skilled in the art can understand that this application is not limited to the foregoing embodiments and many variations and modifications can be made based on the teachings disclosed herein. Any and all these variations and modifications fall within the scope of protection of this application as defined by the appended claims and equivalents thereof

What is claimed is:

1. A semiconductor device, comprising:

a substrate having a first conductivity type;

a shallow trench isolation (STI) structure disposed in the substrate in a form of a first ring-like structure, wherein a portion of the substrate surrounded by the STI structure serves as an active area;

a drain doped region disposed at a top of a central portion of the active area and having a second conductivity type that is opposite to the first conductivity type;

two source doped regions having the second conductivity type, wherein the source doped regions are disposed at the top of the active area on opposite sides of the drain doped region and are spaced apart from the drain doped region, and wherein a line connecting the drain doped region and the source doped regions defines a first direction, and a second direction is defined to be perpendicular to the first direction in a plane of the substrate, wherein the two source doped regions are arranged along the first direction without being arranged along the second direction;

a field oxide layer disposed over a top surface of the substrate within the active area, the field oxide layer being in a form of a second ring-like structure and surrounding the drain doped region, wherein an outer boundary of the field oxide layer is spaced from the STI structure by a predetermined distance that is greater than 0;

a gate polysilicon that is disposed over the top surface of the substrate and is in a form of a third ring-like structure surrounding the field oxide layer, wherein the gate polysilicon extends in the first direction from a position over the source doped regions to a position over the field oxide layer, wherein the gate polysilicon extends in the second direction from a position over the STI structure to a position over the field oxide layer, and wherein a gate oxide layer is provided between the gate polysilicon and the substrate; and a drift region having the second conductivity type, wherein the drift region is disposed in the substrate, surrounds the drain doped region and is spaced apart from the source doped regions, and wherein the drift region extends in the second direction to a position under the STI structure, wherein a portion of the active area extending in the second direction acts as a withstand voltage region of the device; and a portion of the active area extending in the first direction between the drain doped region and the source doped regions serves as an operating and withstand voltage region of the device.

2. The semiconductor device according to claim 1, wherein a length of the field oxide layer in the first direction is smaller than a length of the field oxide layer in the second direction.

3. The semiconductor device according to claim 1, wherein a length of the gate polysilicon in the first direction is smaller than a length of the gate polysilicon in the second direction.

4. The semiconductor device according to claim 1, wherein in the second direction, the predetermined distance from the outer boundary of the field oxide layer to the STI structure ranges from 0.5 μm to 0.8 μm.

5. The semiconductor device according to claim 1, wherein each of the second ring-like structure and the third ring-like structure is an octagon.

6. The semiconductor device according to claim 1, wherein an outer contour of the drift region is an octagon in the plane of the substrate.

7. The semiconductor device according to claim 1, wherein the field oxide layer is formed over the drift region and an outer boundary of the drift region completely encircles and surrounds the outer boundary of the field oxide layer.

8. The semiconductor device according to claim 1, wherein in the plane of the substrate, the source doped regions on opposite sides of the drain doped region are arranged in an axial symmetry with respect to the drain doped region.

9. The semiconductor device according to claim 1, wherein the plane of the substrate is a horizontal plane, and wherein a geometric center of the first ring-like structure, a geometric center of the second ring-like structure, a geometric center of the third ring-like structure and a geometric center of an outer contour of the drift region are in coincidence in the horizontal plane.

10. The semiconductor device according to claim 1, wherein the field oxide layer is a local oxidation of silicon (LOCOS) field oxide layer.

11. The semiconductor device according to claim 1, further comprising a metal field plate spanning over the gate polysilicon and the field oxide layer, wherein a first dielectric layer is disposed between the metal field plate and the gate polysilicon, and a second dielectric layer is disposed between the metal field plate and the field oxide layer.

12. The semiconductor device according to claim 1, wherein a critical dimension of the active area in the second direction is greater than a critical dimension of the active area in the first direction.

13. The semiconductor device according to claim 1, wherein a substrate pickup structure is disposed at an outer side of the source doped regions, wherein the substrate pickup structure has a same conductivity type as a conductivity type of the substrate.

14. The semiconductor device according to claim 1, wherein the semiconductor device is an N-type laterally-double diffused metal-oxide semiconductor (NLDMOS) device with a withstand voltage requirement equal to or greater than 100 V.

15. The semiconductor device according to claim 1, further comprising an N-well formed in the drift region, wherein the N-well surrounding the drain doped region has a depth that is greater than a depth of the drift region.

16. The semiconductor device according to claim 1, wherein an outer contour of the active area in a plane of the substrate comprises an octagon and two rectangles that are adjacent and connected to two sides of the octagon.

* * * * *